US010726873B2

(12) United States Patent
He et al.

(10) Patent No.: US 10,726,873 B2
(45) Date of Patent: Jul. 28, 2020

(54) POLYMORPHIC PLAYBACK SYSTEM WITH SIGNAL DETECTION FILTERS OF DIFFERENT LATENCIES

(71) Applicant: Cirrus Logic International Semiconductor Ltd., Edinburgh (GB)

(72) Inventors: Ku He, Austin, TX (US); Tejasvi Das, Austin, TX (US); Xin Zhao, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/103,288

(22) Filed: Aug. 14, 2018

(65) Prior Publication Data
US 2020/0058326 A1    Feb. 20, 2020

(51) Int. Cl.
*G11B 27/034* (2006.01)
*G11B 27/19* (2006.01)

(52) U.S. Cl.
CPC ........... *G11B 27/034* (2013.01); *G11B 27/19* (2013.01)

(58) Field of Classification Search
CPC ............................. G11B 27/034; G11B 27/19
See application file for complete search history.

(56) References Cited

U.S. PATENT DOCUMENTS

| | | | |
|---|---|---|---|
| 2011/0134980 A1* | 6/2011 | Lipka | H03G 3/3078 375/224 |
| 2015/0140972 A1* | 5/2015 | Zhang | H04W 4/12 455/413 |
| 2016/0314805 A1* | 10/2016 | Mortazavi | G10L 15/28 |

* cited by examiner

Primary Examiner — Girumsew Wendmagegn
(74) Attorney, Agent, or Firm — Jackson Walker L.L.P.

(57) ABSTRACT

A polymorphic playback system is disclosed in which one or more parameters of a signal path of the polymorphic playback system are varied based on one or more characteristics of a playback signal processed by the signal path, wherein the polymorphic playback system may include a lower-latency detection filter, a higher-latency detection filter, and a control subsystem that uses the lower-latency detection filter for detecting the one or more first characteristics of the playback signal and uses the higher-latency detection filter for detecting the one or more second characteristics of the playback signal.

14 Claims, 3 Drawing Sheets

POLYMORPHIC PLAYBACK SYSTEM WITH SIGNAL DETECTION FILTERS OF DIFFERENT LATENCIES

FIELD OF DISCLOSURE

The present disclosure relates in general to circuits for audio devices, including without limitation personal audio devices, such as wireless telephones and media players, and more specifically, to systems and methods for using detection filters of different latencies for the detection of characteristics of a playback signal in a polymorphic playback system.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

A personal audio device may include a polymorphic playback system. A polymorphic playback system may include a playback system in which one or more parameters of a signal path of the playback system are varied based on one or more characteristics of a playback signal processed by the signal path. Examples of a polymorphic playback system include a dynamic range enhancement playback system in which signal gains of a playback path are varied based on one or more characteristics (e.g., signal magnitude) of the playback signal, a multiple processing path playback system in which a processing path for processing the playback signal is selected based on one or more characteristics (e.g., signal magnitude) of the playback signal, an amplifier with a configurable output stage (e.g., configurable as a Class AB output stage or Class D output stage) in which the configuration of the output stage is based on one or more characteristics (e.g., signal magnitude) of the playback signal, or any other suitable polymorphic playback system.

Many playback systems, such as those that perform adaptive noise cancellation, are required to have low latency in their playback paths. In addition, many playback systems include playback signals with a significant amount of out-of-band noise. Such out-of-band noise may influence an in-band signal received by a level detector for detecting a playback signal magnitude in a polymorphic playback system that utilizes the playback signal magnitude as a characteristic for setting one or more parameters of the signal path of the playback system. While a strong low-pass filter could be used to filter out the out-of-band noise, use of a strong low-pass filter may add too much undesirable latency to signal detection.

SUMMARY

In accordance with the teachings of the present disclosure, one or more disadvantages and problems associated with existing approaches to detection of playback signal characteristics in a polymorphic playback system may be reduced or eliminated.

In accordance with embodiments of the present disclosure, a polymorphic playback system is disclosed in which one or more parameters of a signal path of the polymorphic playback system are varied based on one or more characteristics of a playback signal processed by the signal path, wherein the polymorphic playback system may include a lower-latency detection filter, a higher-latency detection filter, and a control subsystem that uses the lower-latency detection filter for detecting the one or more first characteristics of the playback signal and uses the higher-latency detection filter for detecting the one or more second characteristics of the playback signal.

In accordance with these and other embodiments of the present disclosure, a method may be provided for use in a polymorphic playback system in which one or more parameters of a signal path of the polymorphic playback system are varied based on one or more characteristics of a playback signal processed by the signal path, the method including using a lower-latency detection filter for detecting the one or more first characteristics of the playback signal and using a high-latency detection filter for detecting the one or more second characteristics of the playback signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
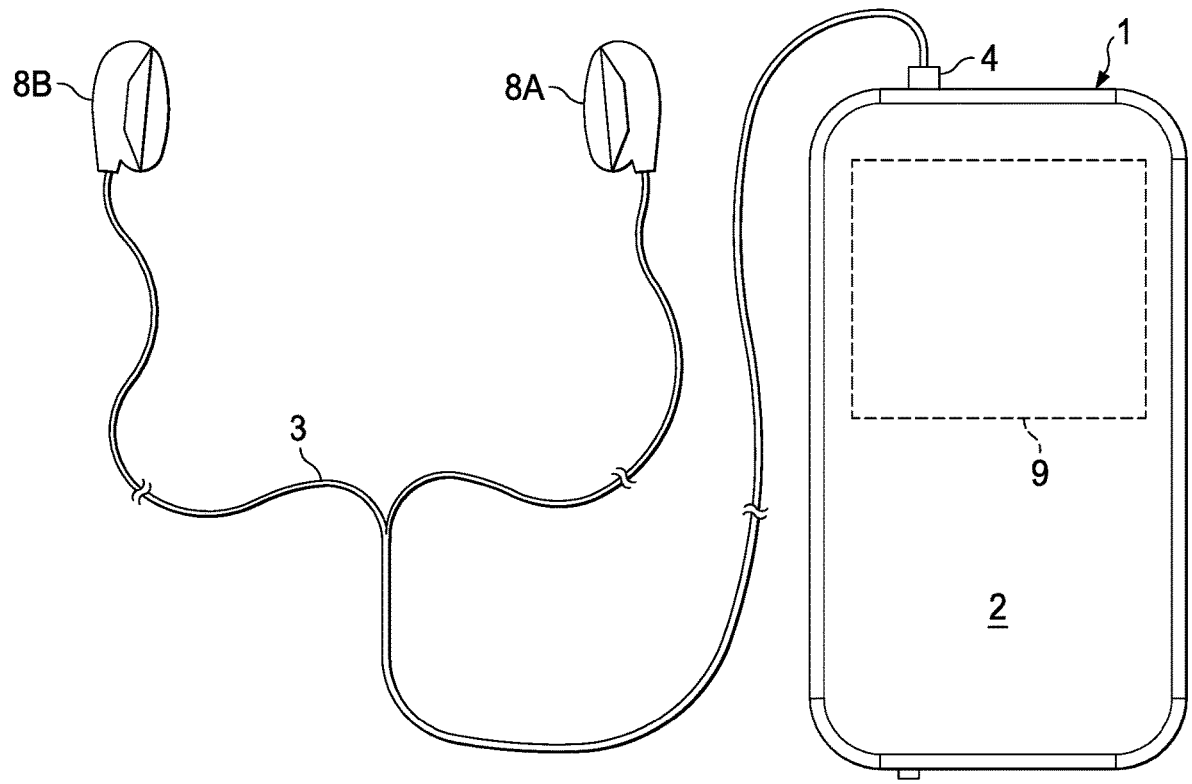
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2A:
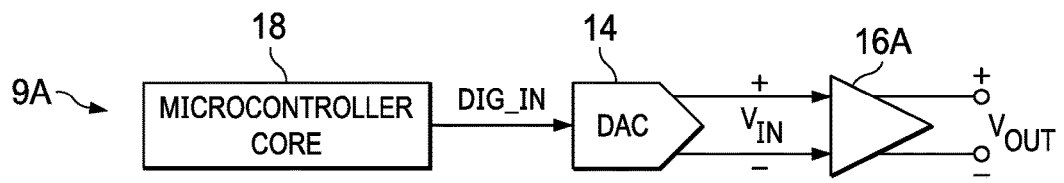
FIG. 2A illustrates a block diagram of selected components of an example audio integrated circuit of a personal audio device, in accordance with embodiments of the present disclosure.

FIG. 2A illustrates a block diagram of selected components of an example audio IC 9A of a personal audio device, in accordance with embodiments of the present disclosure. In some embodiments, example audio IC 9A may be used to implement audio IC 9 of FIG. 1. As shown in FIG. 2A, a microcontroller core 18 may supply a digital audio input signal DIG_IN to a digital-to-analog converter (DAC) 14, which may convert the digital audio input signal to an analog input signal $V_{IN}$. DAC 14 may supply analog input signal $V_{IN}$ to an amplifier 16A which may amplify or attenuate analog input signal $V_{IN}$ to provide an audio output signal $V_{OUT}$, which may operate a speaker, headphone transducer, a line level signal output, and/or other suitable output.

Figure 2B:
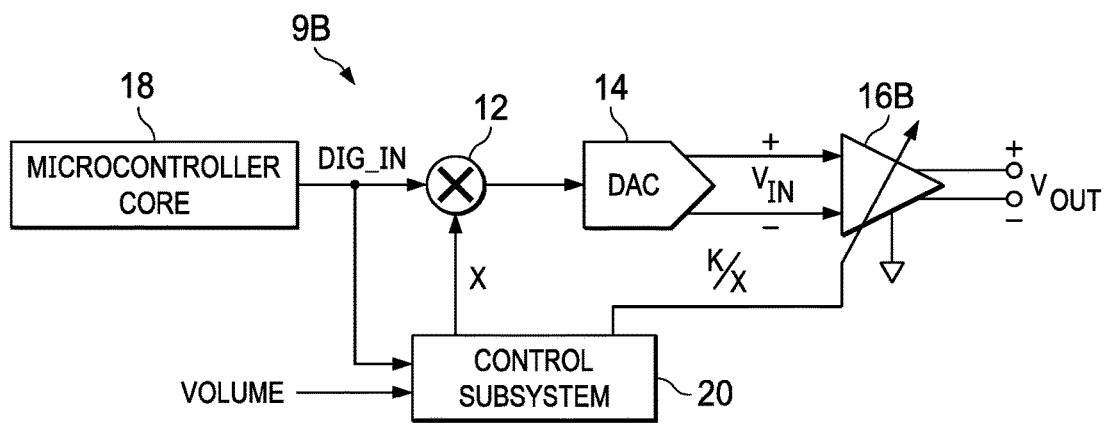
FIG. 2B illustrates a block diagram of selected components of another example audio integrated circuit of a personal audio device, in accordance with embodiments of the present disclosure.

FIG. 2B is a block diagram of selected components of an example audio IC 9B of a personal audio device, in accordance with embodiments of the present disclosure. Example audio IC 9B of FIG. 2B may be similar in many respects to example audio IC 9A of FIG. 2A, except as otherwise described herein. As shown in FIG. 2B, a microcontroller core 18 may supply a digital audio input signal DIG_IN to a digital gain element 12 to apply a selectable digital gain x selected by control subsystem 20 to digital input signal DIG_IN. The amplified digital audio input signal may be communicated to a digital-to-analog converter (DAC) 14, which may convert the digital audio input signal to an analog input signal $V_{IN}$. Together, digital gain element 12 and DAC 14 may be referred to herein as a digital path portion of the signal path from the input node for digital audio input signal DIG_IN to the output node for output voltage signal $V_{OUT}$ depicted in FIG. 2B. In the relevant art, digital gain element 12 and DAC 14 may sometimes be referred to as an audio compressor.

DAC 14 may supply analog input signal $V_{IN}$ to an amplifier 16B which may amplify or attenuate analog input signal $V_{IN}$ in conformity with a selectable analog gain k/x to provide an audio output signal $V_{OUT}$, which may operate a speaker, headphone transducer, a line level signal output, and/or other suitable output. Amplifier 16B may be referred to herein as an analog path portion of the signal path from the input node for digital audio input signal DIG_IN to the output node for output voltage signal $V_{OUT}$ depicted in FIG. 2B. In the relevant art, amplifier 16B may sometimes be referred to as an audio expander.

As shown in FIG. 2B, audio IC 9B may include a control subsystem 20 configured to, based on one or more characteristics of digital audio input signal DIG_IN, control selectable digital gain x of gain element 12 and a selectable analog gain k/x of amplifier 16B. In embodiments in which a volume control is present, a volume control signal may be provided from a microcontroller or other digital control circuit responsive to a user interface, volume knob encoder or program command, or other suitable mechanism.

As an example of the dynamic range enhancement functionality of audio IC 9B, when digital audio input signal DIG_IN is at or near zero decibels (0 dB) relative to the full-scale voltage of the digital audio input signal, control subsystem 20 may select a first digital gain (e.g., $x_1$) for the selectable digital gain and a first analog gain (e.g., $k/x_1$) for the selectable analog gain. However, if the magnitude of digital audio input signal DIG_IN is below a particular predetermined threshold magnitude relative to the full-scale voltage of digital audio input signal DIG_IN (e.g., −20 dB), control subsystem 20 may select a second digital gain (e.g., $x_2$) greater than the first digital gain (e.g., $x_2 > x_1$) for the selectable digital gain and a second analog gain (e.g., $k/x_2$) lesser than the second analog gain (e.g., $k/x_2 < k/x_1$) for the selectable analog gain. In each case, the cumulative path gain (e.g., k) of the selectable digital gain and the selectable analog gain may be substantially constant (e.g., the same within manufacturing and/or operating tolerances of audio IC 9B). In some embodiments, k may be approximately equal to 1, such that the cumulative path gain is a unity gain. Such modification of digital gain and analog gain may increase the dynamic range of audio IC 9B compared to approaches in which the digital gain and analog gain are static, as it may reduce the noise injected into audio output signal $V_{OUT}$, which noise may be a generally monotonically increasing function of the analog gain of amplifier 16B. While such noise may be negligible for higher magnitude audio signals (e.g., at or near 0 dB relative to full-scale voltage), the presence of such noise may become noticeable for lower magnitude audio signals (e.g., at or near −20 dB or lower relative to full-scale voltage). By applying a smaller analog gain at amplifier 16B for smaller signal magnitudes, the amount of noise injected into audio output signal $V_{OUT}$ may be reduced, while the signal level of audio output signal $V_{OUT}$ may be maintained in accordance with the digital audio input signal DIG_IN through application of a digital gain to gain element 12 inversely proportional to the analog gain.

Figure 3:
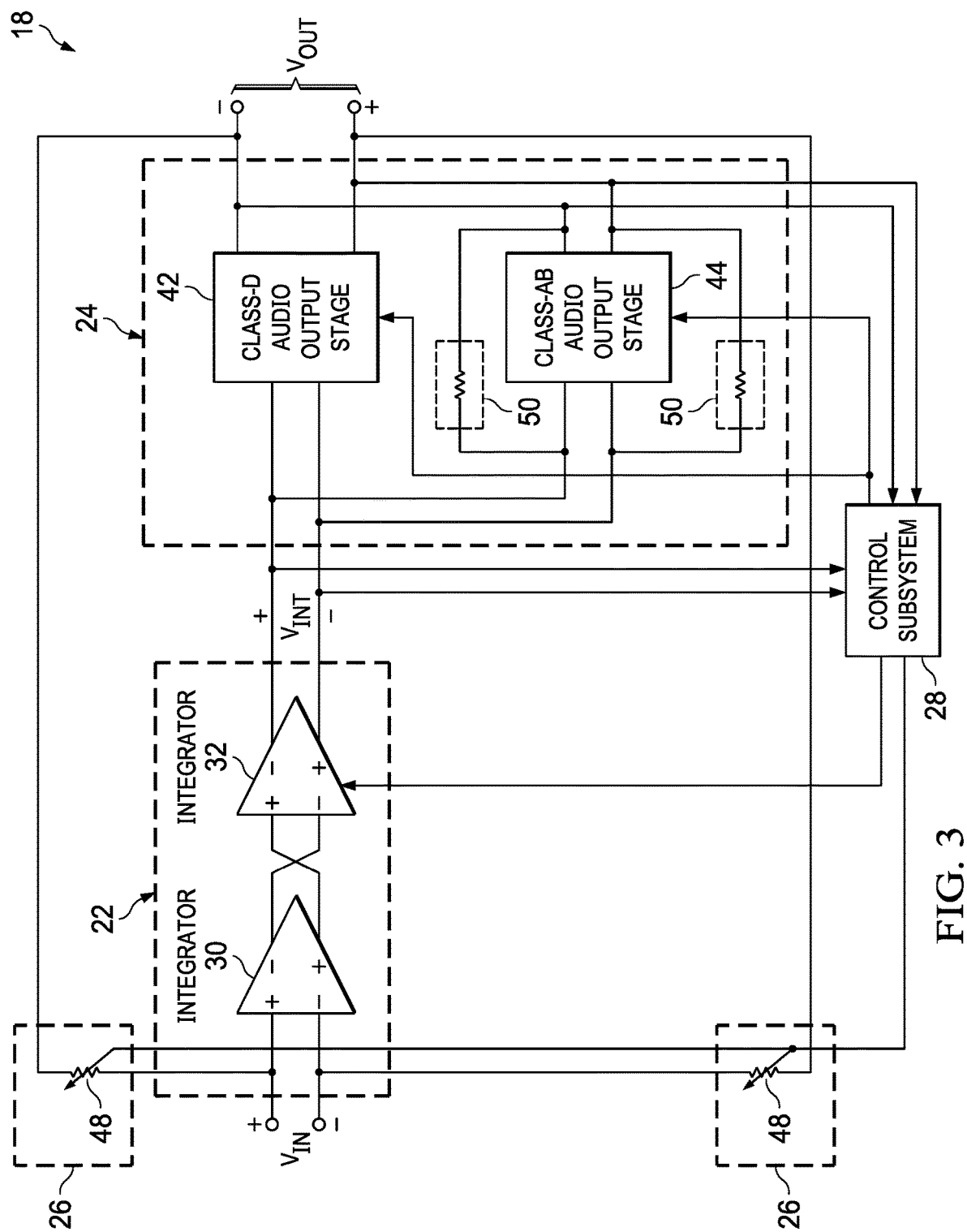
FIG. 3 illustrates a block diagram of selected components of an example amplifier, in accordance with embodiments of the present disclosure.

FIG. 3 illustrates a block diagram of selected components of an example amplifier 18, in accordance with embodiments of the present disclosure. In some embodiments, amplifier 18 may be used to implement all or a portion of amplifier 16A of FIG. 2A. In these and other embodiments, amplifier 18 may be used to implement all or a portion of amplifier 16B of FIG. 2B.

As shown in FIG. 3, amplifier 18 may include a first stage 22 (e.g., an analog front end) configured to receive analog input signal $V_{IN}$ at an amplifier input of amplifier 18 and generate an intermediate signal $V_{INT}$ which is a function of analog input signal $V_{IN}$, a final output stage 24 configured to generate audio output signal $V_{OUT}$ at an amplifier output of amplifier 18 as a function of intermediate signal $V_{INT}$, a signal feedback network 26 coupled between the amplifier output and the amplifier input, and a control subsystem 28 for controlling the operation of certain components of amplifier 18, as described in greater detail below.

First stage 22 may include any suitable analog front end circuit for conditioning analog input signal $V_{IN}$ for use by final output stage 24. For example, first stage 22 may include one or more analog integrators 32 cascaded in series, as shown in FIG. 3.

Final output stage 24 may include any suitable driving circuit for driving audio output signal $V_{OUT}$ as a function of intermediate signal $V_{INT}$ (thus, also making audio output signal $V_{OUT}$ a function of analog input signal $V_{IN}$) wherein final output stage 24 is switchable among a plurality of modes including at least a first mode in which final output stage 24 generates audio output signal $V_{OUT}$ as a modulated output signal which is a function of intermediate signal $V_{INT}$ and a second mode in which final output stage 24 generates audio output signal $V_{OUT}$ as an unmodulated output signal which is a function of intermediate signal $V_{INT}$. To carry out this functionality, final output stage 24 may include a class-D audio output stage 42 which may be enabled in the first mode (and disabled in the second mode) to generate audio output signal $V_{OUT}$ as a modulated output signal which is a function of intermediate signal $V_{INT}$ and a class-AB audio output stage 44 which may be enabled in the second mode (and disabled in the first mode) to generate audio output signal $V_{OUT}$ as an unmodulated output signal which is a function of intermediate signal $V_{INT}$.

Class-D audio amplifier 42 may comprise any suitable system, device, or apparatus configured to amplify intermediate signal $V_{INT}$ and convert intermediate signal $V_{INT}$ into a series of pulses by pulse width modulation, pulse density modulation, or another method of modulation, such that intermediate signal $V_{INT}$ is converted into a modulated signal in which a characteristic of the pulses of the modulated signal (e.g., pulse widths, pulse density, etc.) is a function of the magnitude of intermediate signal $V_{INT}$. After amplification by class-D audio amplifier 42, its output pulse train may be converted back to an unmodulated analog signal by passing through a passive low-pass filter, wherein such low-pass filter may be inherent in output circuitry of class-D audio amplifier 42 or a load driven by final output stage 24. As shown in FIG. 3, class-D audio amplifier 42 may include a control input for receiving a control input from control subsystem 28 in order to selectively enable class-D audio amplifier 42 during the first mode and disable class-D audio amplifier 42 during the second mode (e.g., prevent class-D audio amplifier 42 from driving the amplifier output of amplifier 18 by disabling or decoupling a supply voltage from class-D audio amplifier 42 or by disabling or decoupling driving devices of the amplifier output of amplifier 18).

Class-AB audio amplifier 44 may comprise any suitable system, device, or apparatus configured to amplify intermediate signal $V_{INT}$ with a linear gain and convert intermediate signal $V_{INT}$ into an unmodulated audio output signal $V_{OUT}$. As shown in FIG. 3, class-AB audio amplifier 44 may include a control input for receiving a control input from control subsystem 28 in order to selectively enable class-AB audio amplifier 44 during the second mode and disable class-AB audio amplifier 44 during the first mode (e.g., prevent class-AB audio amplifier 44 from driving the amplifier output of amplifier 18 by disabling or decoupling a supply voltage from class-AB audio amplifier 44 or by disabling or decoupling driving devices of the amplifier output of amplifier 18).

In some embodiments, a signal gain (e.g., $V_{OUT}/V_{INT}$) of final output stage 24 in the first mode may be approximately equal to the signal gain of final output stage 24 in the second mode. In these and other embodiments, an offset (e.g., direct current offset) of final output stage 24 in the first mode may be approximately equal to the offset of final output stage 24 in the second mode.

Signal feedback network 26 may include any suitable feedback network for feeding back a signal indicative of audio output signal $V_{OUT}$ to the amplifier input of amplifier 18. For example, as shown in FIG. 3, signal feedback network 26 may include variable feedback resistors 48, wherein resistances of variable feedback resistors 48 are controlled by control signals received from control subsystem 28, as described in greater detail below.

Control subsystem 28 may include any suitable system, device, or apparatus configured to receive information indicative of audio output voltage $V_{OUT}$, intermediate signal $V_{INT}$, and/or other operational characteristics of amplifier 18, and based at least thereon, control operation of one or more components of amplifier 18. For example, control subsystem 28 may be configured to, based on a characteristic of analog input signal $V_{IN}$ (e.g., which may be determined from receiving and analyzing intermediate signal $V_{INT}$ and/or audio output signal $V_{OUT}$), switch between the first mode and the second mode of final output stage 24. Such characteristic may include one or more of a frequency of analog input signal $V_{IN}$, an amplitude of analog input signal $V_{IN}$, a signal-to-noise ratio of analog input signal $V_{IN}$, a noise floor of analog input signal $V_{IN}$, or another noise characteristic of analog input signal $V_{IN}$. For example, in some embodiments, control subsystem 28 may be configured to switch final output stage 24 from the first mode to the second mode when an amplitude of analog input signal $V_{IN}$ decreases below a threshold amplitude, and may be configured to switch final output stage 24 from the second mode to the first mode when an amplitude of analog input signal $V_{IN}$ increases above the same threshold amplitude or another threshold amplitude. In some embodiments, to reduce audio artifacts associated with switching between modes, control subsystem 28 may also be configured to switch between modes only when the amplitude of audio output signal $V_{OUT}$ is approximately zero (e.g., when a modulated signal generated by class-D audio amplifier 42 is at its minimum voltage in its generated pulse train).

In addition, control subsystem 28 may also be configured to perform calibration of final output stage 24. For example, control subsystem 28 may receive and analyze intermediate signal $V_{INT}$ and audio output signal $V_{OUT}$ to determine a gain of class-D audio amplifier 42 (e.g., the signal gain of final output stage 24 in the first mode) and a gain of class-AB audio amplifier 44 (e.g., the signal gain of final output stage 24 in the second mode), and based thereon, modify the gain of class-D audio amplifier 42 and/or the gain of class-AB audio amplifier 44 in order to calibrate the signal gain of final output stage 24 in the second mode to match the signal gain of final output stage 24 in the first mode. As another example, control subsystem 28 may receive and analyze intermediate signal $V_{INT}$ and/or audio output signal $V_{OUT}$ to determine an offset (e.g., direct current offset) of class-D audio amplifier 42 (e.g., the offset of final output stage 24 in the first mode) and an offset of class-AB audio amplifier 44 (e.g., the offset of final output stage 24 in the second mode), and based thereon, modify the offset of class-D audio amplifier 42 and/or the offset of class-AB audio amplifier 44 in order to calibrate the offset of final output stage 24 in the second mode to match the offset of final output stage 24 in the first mode.

In these and other embodiments, control subsystem 28 may also be configured to control characteristics of first stage 22 (e.g., integrators 32) and/or signal feedback network 26. Control subsystem 28 may maintain such characteristics and structure of first stage 22 and signal feedback network 26 as static when switching between the first mode and the second mode of final output stage 24 and when switching between the second mode and the first mode. Maintaining the characteristics and structure of first stage 22 and signal feedback network 26 as static when switching between modes allows the modes to share the same analog front end and feedback network, thus reducing or minimizing the likelihood of mismatched signal gain and offset between the modes, and thus reducing or minimizing audio artifacts caused by switching between modes. However, after control subsystem 28 has switched final output stage 24 to the second mode (e.g., amplifier output driven by class-AB audio amplifier 44), control subsystem 28 may modify characteristics of first stage 22 and/or signal feedback network 26 in order to decrease a noise floor of amplifier 18.

For example, in some embodiments, control subsystem 28 may modify characteristics of integrators 32 (e.g., resistances and/or capacitances of filters internal to integrators 32) and/or other components of first stage 22 in order to decrease a noise floor of amplifier 18 when final output stage 24 operates in the second mode. As another example, in these and other embodiments, control subsystem 28 may modify characteristics of signal feedback network 26 (e.g., resistances of variable feedback resistors 48) in order to decrease a noise floor of amplifier 18 when final output stage 24 operates in the second mode. When making such modification, control subsystem 28 may, before switching final output stage 24 from the second mode to the first mode, return such characteristics to their unmodified states.

Figure 4:
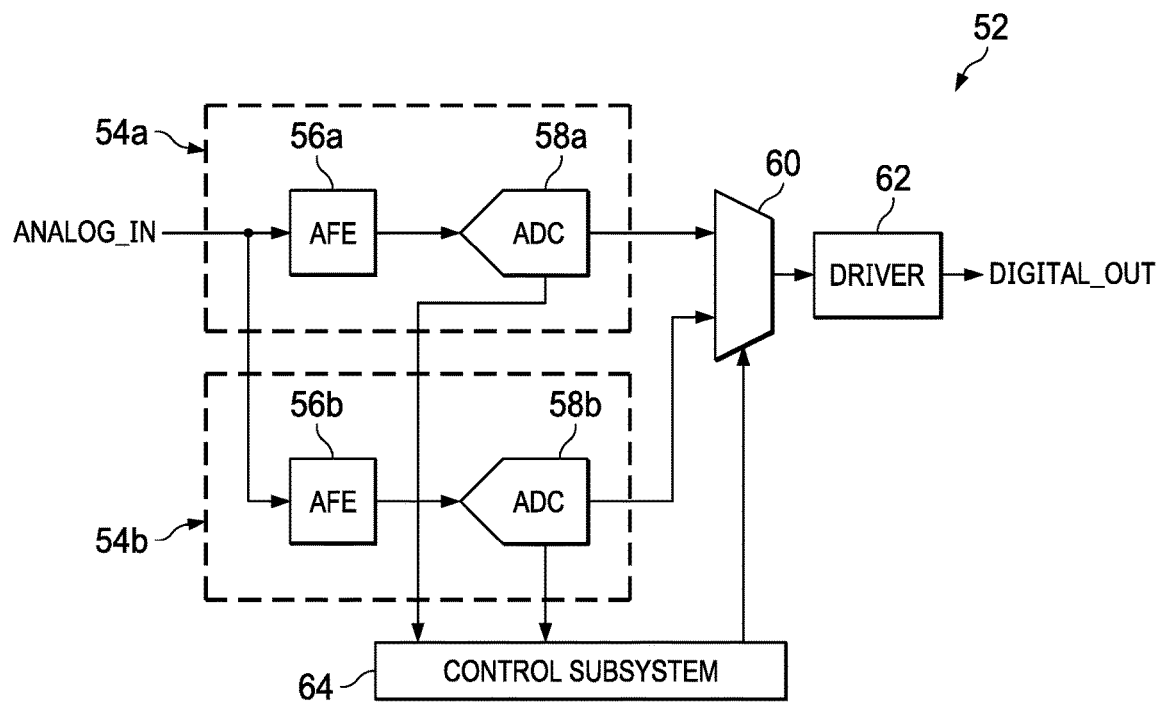
FIG. 4 illustrates a block diagram of selected components of a digital microphone integrated circuit, in accordance with embodiments of the present disclosure.

FIG. 4 illustrates a block diagram of selected components of a digital microphone IC 52, in accordance with embodiments of the present disclosure. As shown in FIG. 4, digital microphone IC 52 may include two or more audio processing paths 54a and 54b (which may be referred to herein individually as an audio processing path 54 and collectively as AFE/ADC paths 54), each AFE/ADC path 54 including a respective AFE 56 (e.g., AFE 56a, AFE 56b) and a respective ADC (e.g., ADC 58a, ADC 58b). An AFE 56 may receive an analog audio input signal ANALOG_IN via one or more input lines which may allow for receipt of a single-ended signal, differential signal, or any other suitable analog audio signal format and may comprise any suitable system, device, or apparatus configured to condition analog audio input signal ANALOG_IN for processing by ADC 58. In some embodiments, analog audio input signal ANALOG_IN may comprise an electronic signal generated by a microphone as a function of sound pressure incident upon the microphone. The output of each AFE 56 may be communicated to a respective ADC 58 on one or more output lines.

An ADC 58 may comprise any suitable system, device, or apparatus configured to convert an analog audio signal received at its input, to a digital signal representative of analog audio input signal ANALOG_IN. ADC 58 may itself include one or more components (e.g., delta-sigma modulator, decimator, etc.) for carrying out the functionality of ADC 58.

A multiplexer 60 may receive a respective digital audio signal from each of audio processing paths 54, and may select one of the digital audio signals as the digital audio output signal DIGITAL_OUT based on a control signal generated by and communicated from a control subsystem 64.

Driver 62 may receive the digital audio output signal DIGITAL_OUT output by ADC 58 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital audio output signal DIGITAL_OUT for transmission over a bus to a digital audio processor. In FIG. 2, the bus receiving digital audio output signal DIGITAL_OUT is shown as single-ended. In some embodiments, driver 62 may generate digital audio output signal DIGITAL_OUT as a differential digital audio output signal.

Control subsystem 64 may comprise any suitable system, device, or apparatus for selecting one of the digital audio signals output by the various audio processing paths 54 as digital audio output signal DIGITAL_OUT. In some embodiments, control subsystem 64 may make such selection based on a magnitude of analog audio input signal ANALOG_IN or a signal derivative thereof. For example, control subsystem 64 may include an overload detector that may determine whether or not a signal derivative of analog audio input signal ANALOG_IN (e.g., an analog signal output by AFE 56a) is likely to cause clipping or other distortion of digital audio output signal DIGITAL_OUT if a particular audio processing path (e.g., audio processing path 54a) is selected. If clipping or other distortion of digital audio output signal DIGITAL_OUT is likely if the particular audio processing path (e.g., audio processing path 54a) is selected, control subsystem 64 may generate a control signal so that another audio processing path (e.g., audio processing path 54b) is selected. To further illustrate, in some embodiments, audio processing path Ma may be a path adapted for low amplitudes of analog audio input signal ANALOG_IN and may thus have a high signal gain, while audio processing path Mb may be a path adapted for higher amplitudes of analog audio input signal ANALOG_IN and may thus have a lower signal gain. Thus, if analog audio input signal ANALOG_IN or a derivative thereof is greater than a threshold value indicative of a condition whereby digital audio output signal DIGITAL_OUT may experience clipping or other distortion if audio processing path Ma is selected, control subsystem 64 may detect such condition and generate a control signal to select the digital audio signal generated by audio processing path 54b as digital audio output signal DIGITAL_OUT.

As another example, control subsystem 64 may include a level detector that may detect an amplitude of analog audio input signal ANALOG_IN or a signal derivative thereof (e.g., a signal generated within ADC 58b). Responsive to the amplitude level detected by the level detector, control subsystem 64 may generate the control signal communicated to multiplexer 60. To illustrate, as analog audio input signal ANALOG_IN decreases from a relatively high amplitude to a lower amplitude, it may cross a threshold amplitude level whereby control subsystem 64 may change the selection of digital audio output signal DIGITAL_OUT from the digital audio signal generated by audio processing path 54b (which may be adapted for higher amplitudes of analog audio input signal ANALOG_IN) to the digital audio signal generated by audio processing path Ma (which may be adapted for lower amplitudes of analog audio input signal ANALOG_IN). In some embodiments, a threshold amplitude level whereby control subsystem 64 may change the selection of digital audio output signal DIGITAL_OUT from the digital audio signal generated by audio processing path 54b to the digital audio signal generated by audio processing path Ma may be lower than another threshold amplitude level whereby control subsystem 64 may change the selection of digital audio output signal DIGITAL_OUT from the digital audio signal generated by audio processing path Ma to the digital audio signal generated by audio processing path 54b, in order to provide for hysteresis so that multiplexer 60 does not repeatedly switch between the paths.

Each of the various systems described above with respect to FIGS. 2A-4 (e.g., audio IC 9A, audio IC 9B, amplifier 18, digital microphone IC 52) may comprise a polymorphic playback system or an integral portion thereof, in that in each of such systems, one or more parameters of a signal path of such polymorphic playback system may be varied based on one or more characteristics of a playback signal processed by the signal path. Although FIGS. 2A-4 set forth specific examples of a polymorphic playback system, a polymorphic playback system may include any other type of system in which one or more parameters of a signal path of such system is varied based on one or more characteristics of a playback signal processed by the signal path.

Figure 5:
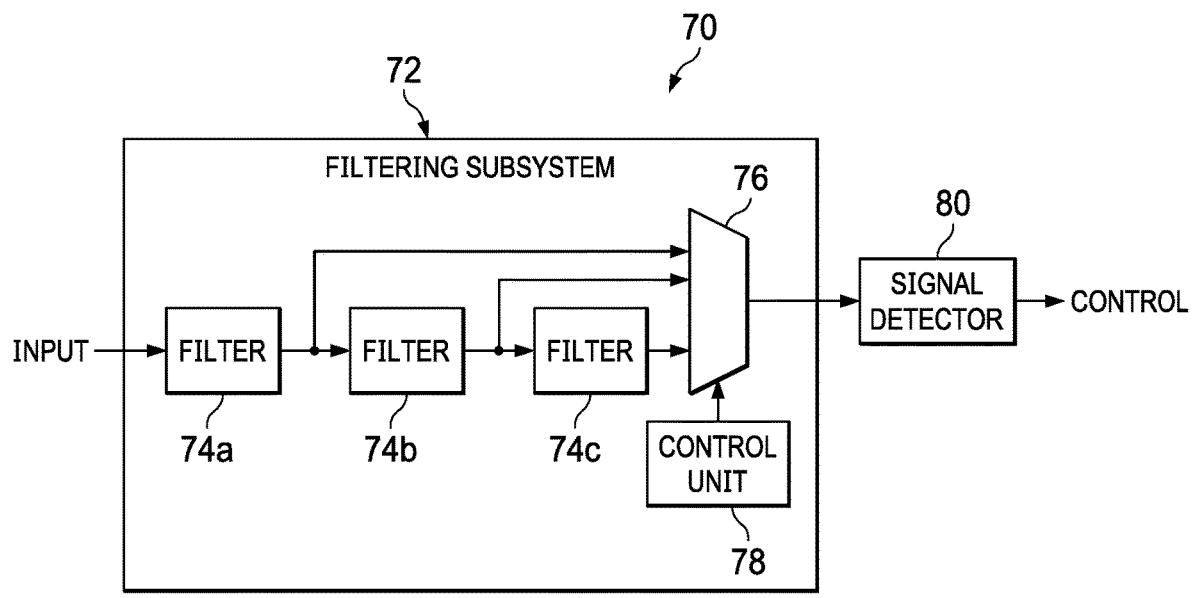
FIG. 5 illustrates a block diagram of selected components of a signal detection circuit, in accordance with embodiments of the present disclosure.

FIG. 5 illustrates a block diagram of selected components of a signal detection circuit 70, in accordance with embodiments of the present disclosure. Signal detection circuit 70 may be used to implement a portion of one or more of control subsystem 20, control subsystem 28, and control subsystem 64. As shown in FIG. 5, signal detection circuit 70 may comprise a filtering subsystem 72 and signal detector 80.

Filter subsystem 72 may comprise any suitable system, device, or apparatus configured to filter an input signal (e.g., a playback signal to be processed by a signal path of a playback system) with a latency of filter subsystem 72 (and accordingly a filtering strength of such filter subsystem) that varies in accordance with one or more characteristics of the input signal to be detected by signal detection circuit 70. To that end, filter subsystem 72 may comprise a plurality of cascaded filters 74 (e.g., filters 74a, 74b, and 74c, arranged as shown), a multiplexer 76, and a control unit 78. Filters 74 may be arranged such that filter 74a performs filtering of the input signal to filter subsystem 72 to generate a first filtered signal, filter 74b performs filtering of the first filtered signal to generate a second filtered signal, and filter 74c performs filtering of the second filtered signal to generate a third filtered signal. In some embodiments, one or more of filters 74 may comprise a low-pass filter. For the purposes of clarity and exposition, FIG. 5 depicts three cascaded filters 74. However, filtering subsystem 72 may comprise any suitable number of cascaded filters 74. In addition, in some embodiments, in lieu of cascaded filters 74, filtering subsystem 72 may comprise a plurality of parallel filters, wherein each filter has a different latency.

Multiplexer 76 may receive the outputs of the various filters 74 and output one of such outputs to signal detector 80 based on a control signal generated by control unit 78. Control unit 78 may generate a control signal to control selection of a desired filter output by multiplexer based on one or more characteristics of the input signal to be detected by signal detection circuit 70.

Signal detector 80 may comprise any suitable system, device, or apparatus configured to detect one or more characteristics of the input signal to be detected by signal detection circuit 70, and then generate one or more control signals responsive to detection of the one or more characteristics in order to control one or more parameters of a polymorphic playback system based on the detected one or more characteristics. For example, signal detector 80 may include a zero-cross detection circuit for detecting the occurrence of a zero crossing of a playback signal (or a derivative thereof) and outputting a signal indicating that a zero crossing of such signal has occurred. A zero crossing of a signal may occur when the waveform of such signal crosses a magnitude of zero or crosses another level within a threshold of zero and indicative of a zero crossing (e.g., a low signal level of lower than −70 dB or, in the case of a digital playback signal, within a small number of least significant bits of zero). In some embodiments, in connection with the zero-cross detection circuit, signal detector 80 may comprise a slew rate detection circuit that detects a slew rate of a playback signal at the zero crossing of the playback signal.

As another example, signal detector 80 may comprise an overload detector configured to determine if any signal within the signal path of a polymorphic playback system is likely to cause clipping or other distortion at the output of the signal path if one or more parameters of the playback path are selected.

As a further example, signal detector 80 may comprise a frequency detector configured to determine spectral content of a playback signal.

As yet another example, signal detector 80 may comprise a level detector configured to determine a magnitude of a playback signal.

In accordance with the foregoing, a polymorphic playback system in which one or more parameters of a signal path of the polymorphic playback system are varied based on one or more characteristics of a playback signal processed by the signal path may include a lower-latency detection filter, a higher-latency detection filter, and a control subsystem that uses the lower-latency detection filter for detecting the one or more first characteristics of the playback signal and uses the higher-latency detection filter for detecting the one or more second characteristics of the playback signal. For example, the lower-latency detection filter may exist in FIG. 5 when control unit 78 causes multiplexer 76 to select the output of filter 74a, and the higher-latency detection filter may exist in FIG. 5 when control unit 78 causes multiplexer 76 to select the output of filter 74c.

The one or more first characteristics may comprise characteristics in which low-latency filtering is desired and/or a low amount of filtering is needed. Examples of such one or more first characteristics may comprise one or more of detection of a slew rate of the playback signal at a zero crossing of the playback signal, a determination of whether the playback signal causes signal clipping in the signal path, and a determination of spectral content of the playback signal.

The one or more second characteristics may comprise characteristics in which high-latency filtering is acceptable and/or robust filtering is required. Examples of such one or more second characteristics may comprise detection of a signal magnitude of the playback signal. Accordingly, signal detection circuit 70 may enable trading off between filter latency and filter robustness based on requirements for one or more characteristics to be detected by signal detection circuit 70.

In some embodiments, a control subsystem may be configured to power down the lower-latency detection when the lower-latency detection filter is not in use. For example, when filtering subsystem 72 comprises a lower-latency filter in parallel with a higher-latency filter, and the higher-latency filter is in use, a control subsystem may power down the lower-latency filter.

Similarly, a control subsystem may be configured to power down the higher-latency detection when the higher-latency detection filter is not in use. For example, when filtering subsystem 72 comprises a lower-latency filter in parallel with a higher-latency filter, and the lower-latency filter is in use, a control subsystem may power down the higher-latency filter. As another example, when filtering subsystem 72 comprises a plurality of cascaded filters 74, filtering subsystem 72 may power down filters 74 having outputs that are not used (e.g., powering down filters 74b and 74c when control unit 78 causes multiplexer 76 to pass the output of filter 74a).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A polymorphic playback system wherein one or more parameters of a signal path of the polymorphic playback system are varied based on one or more characteristics of a playback signal processed by the signal path, comprising:
a lower-latency detection filter;
a higher-latency detection filter; and
a control subsystem that:
uses the lower-latency detection filter for detecting the one or more first characteristics of the playback signal; and
uses the higher-latency detection filter for detecting the one or more second characteristics of the playback signal.

2. The system of claim 1, wherein the one or more first characteristics of the playback signal include one or more of detection of a slew rate of the playback signal at a zero crossing of the playback signal, a determination of whether the playback signal causes signal clipping in the signal path, and a determination of spectral content of the playback signal.

3. The system of claim 1, wherein the one or more second characteristics of the playback signal include detection of a signal magnitude of the playback signal.

4. The system of claim 1, wherein the control subsystem is configured to power down the lower-latency detection filter when the lower-latency detection filter is not in use.

5. The system of claim 1, wherein the control subsystem is configured to power down the higher-latency detection filter when the higher-latency detection filter is not in use.

6. The system of claim 1, wherein the one or more parameters include an analog gain and a digital gain of the signal path.

7. The system of claim 1, wherein the one or more parameters include a noise floor of the signal path.

8. A method for use in a polymorphic playback system wherein one or more parameters of a signal path of the polymorphic playback system are varied based on one or more characteristics of a playback signal processed by the signal path, comprising:
using a lower-latency detection filter for detecting the one or more first characteristics of the playback signal; and
using a higher-latency detection filter for detecting the one or more second characteristics of the playback signal.

9. The method of claim 8, wherein the one or more first characteristics of the playback signal include one or more of detection of a slew rate of the playback signal at a zero crossing of the playback signal, a determination of whether the playback signal causes signal clipping in the signal path, and a determination of spectral content of the playback signal.

10. The method of claim 8, wherein the one or more second characteristics of the playback signal include detection of a signal magnitude of the playback signal.

11. The method of claim 8, further comprising powering down the lower-latency detection filter when the lower-latency detection filter is not in use.

12. The method of claim 8, further comprising powering down the higher-latency detection filter when the higher-latency detection filter is not in use.

13. The method of claim 8, wherein the one or more parameters include an analog gain and a digital gain of the signal path.

14. The method of claim 8, wherein the one or more parameters include a noise floor of the signal path.

* * * * *